(12) United States Patent
Hung

(10) Patent No.: US 11,177,589 B2
(45) Date of Patent: Nov. 16, 2021

(54) ELECTRICAL TERMINAL AND ELECTRICAL CONNECTOR THEREOF

(71) Applicant: Dongguan Luxshare Technologies Co., Ltd, Dongguan (CN)

(72) Inventor: Yung-Chih Hung, Dongguan (CN)

(73) Assignee: DONGGUAN LUXSHARE TECHNOLOGIES CO., LTD., Dongguan (CN)

( * ) Notice: Subject to any disclaimer, the term of this patent is extended or adjusted under 35 U.S.C. 154(b) by 0 days.

(21) Appl. No.: 16/918,776

(22) Filed: Jul. 1, 2020

(65) Prior Publication Data
US 2020/0335889 A1 Oct. 22, 2020

(30) Foreign Application Priority Data
Nov. 4, 2019 (TW) .................. 108139987

(51) Int. Cl.
| | |
|---|---|
| H01R 12/68 | (2011.01) |
| H01R 12/58 | (2011.01) |
| H05K 3/30 | (2006.01) |
| H01R 12/70 | (2011.01) |
| H01R 13/40 | (2006.01) |
| H01R 13/502 | (2006.01) |
| H01R 13/26 | (2006.01) |

(52) U.S. Cl.
CPC ......... *H01R 12/58* (2013.01); *H01R 12/7005* (2013.01); *H01R 13/26* (2013.01); *H01R 13/40* (2013.01); *H01R 13/502* (2013.01); *H05K 3/301* (2013.01); *H05K 3/308* (2013.01); *H05K 2201/10189* (2013.01)

(58) Field of Classification Search
CPC .... H01R 12/58; H01R 12/7005; H01R 13/26; H01R 13/40; H01R 13/502
USPC .......................................... 439/626
See application file for complete search history.

(56) References Cited

U.S. PATENT DOCUMENTS

| | | | | |
|---|---|---|---|---|
| 4,047,791 A | * | 9/1977 | Carter .................. | H01R 13/193 439/828 |
| 5,240,439 A | * | 8/1993 | Egenolf ................. | H01R 13/18 439/745 |
| 5,246,390 A | * | 9/1993 | Egenolf ................. | H01R 13/18 439/839 |
| 5,338,229 A | * | 8/1994 | Egenolf ................. | H01R 13/18 439/839 |

(Continued)

FOREIGN PATENT DOCUMENTS

| | | |
|---|---|---|
| CN | 1682414 B | 5/2010 |
| CN | 203747183 U | 7/2014 |

(Continued)

*Primary Examiner* — Peter G Leigh
(74) *Attorney, Agent, or Firm* — Birch, Stewart, Kolasch & Birch, LLP

(57) ABSTRACT

An electrical terminal includes a terminal body and a mounting portion. The terminal body has a front edge, a rear edge, and two opposite lateral edges. At least part of the terminal body is bent, and the two lateral edges are butt jointed to form a buttjoint portion. The buttjoint portion has a joint seam between the two lateral edges which are butt jointed, and the buttjoint portion further includes a stamped groove spanning the joint seam. The mounting portion extends from the terminal body. An electrical connector is also provided, which includes a base and the electrical terminal.

22 Claims, 10 Drawing Sheets

(56) References Cited

U.S. PATENT DOCUMENTS

| | | | | |
|---|---|---|---|---|
| 5,362,262 | A * | 11/1994 | Hotea | H01R 13/18 439/839 |
| 5,624,283 | A * | 4/1997 | Hotea | H01R 13/18 439/751 |
| 5,716,244 | A * | 2/1998 | Egenolf | H01R 13/18 439/843 |
| 5,741,162 | A * | 4/1998 | Kourimsky | H01R 13/432 439/746 |
| 5,755,599 | A * | 5/1998 | Hotea | H01R 13/18 439/745 |
| 6,666,734 | B2 * | 12/2003 | Fukatsu | H01R 13/055 29/33 M |
| 6,749,470 | B2 * | 6/2004 | Dangelmaier | H01R 13/193 439/857 |
| 7,422,494 | B2 * | 9/2008 | Fry, Jr. | H01R 13/15 439/891 |
| 7,744,408 | B2 | 6/2010 | Komatsu | |
| 7,867,014 | B2 * | 1/2011 | Kuwayama | H01R 4/185 439/452 |
| 7,976,353 | B2 * | 7/2011 | Myer | H01R 13/04 439/891 |
| 8,323,049 | B2 | 12/2012 | Ngo | |
| 8,979,602 | B2 * | 3/2015 | Cappe | H01R 43/16 439/884 |
| 9,484,666 | B2 * | 11/2016 | Wu | H01R 13/11 |
| 9,705,229 | B2 * | 7/2017 | Itou | H01R 4/184 |
| 9,941,615 | B2 * | 4/2018 | Saito | H01R 9/24 |
| 10,050,395 | B2 * | 8/2018 | Ngo | H01R 25/162 |
| 10,317,290 | B2 * | 6/2019 | Terajima | H01R 13/187 |
| 10,389,054 | B1 * | 8/2019 | Neumann | H01R 13/112 |
| 2018/0024012 | A1 * | 1/2018 | Terajima | H01R 4/62 439/751 |

FOREIGN PATENT DOCUMENTS

| | | |
|---|---|---|
| CN | 102301537 B | 8/2014 |
| CN | 206283014 U | 6/2017 |
| CN | 206283046 U | 6/2017 |
| CN | 206806561 U | 12/2017 |
| CN | 206908021 U | 1/2018 |
| CN | 207265268 U | 4/2018 |
| CN | 208889908 U | 5/2019 |
| TW | M554646 U | 1/2018 |

* cited by examiner

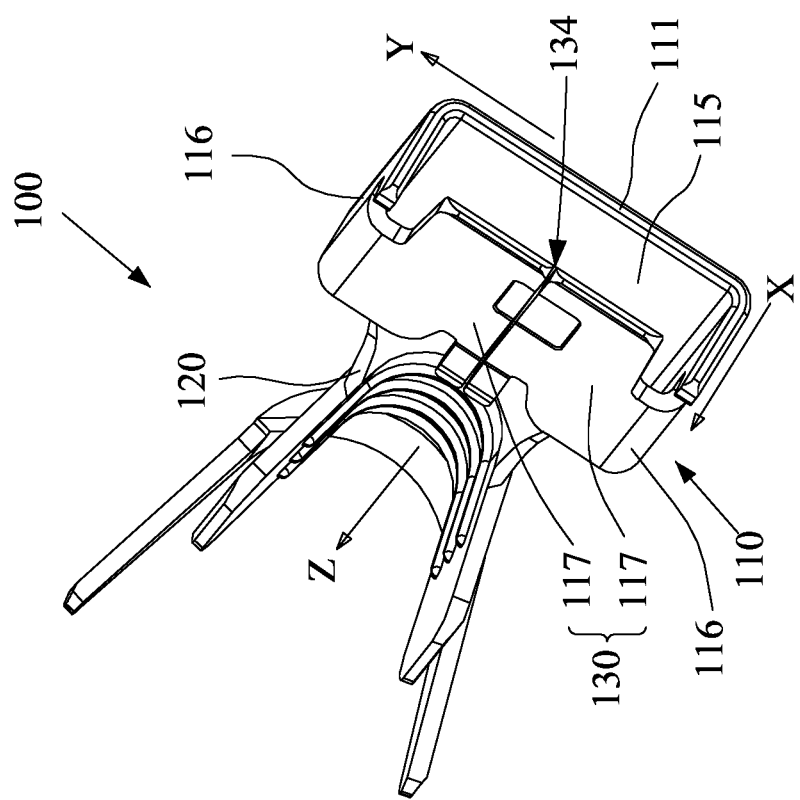
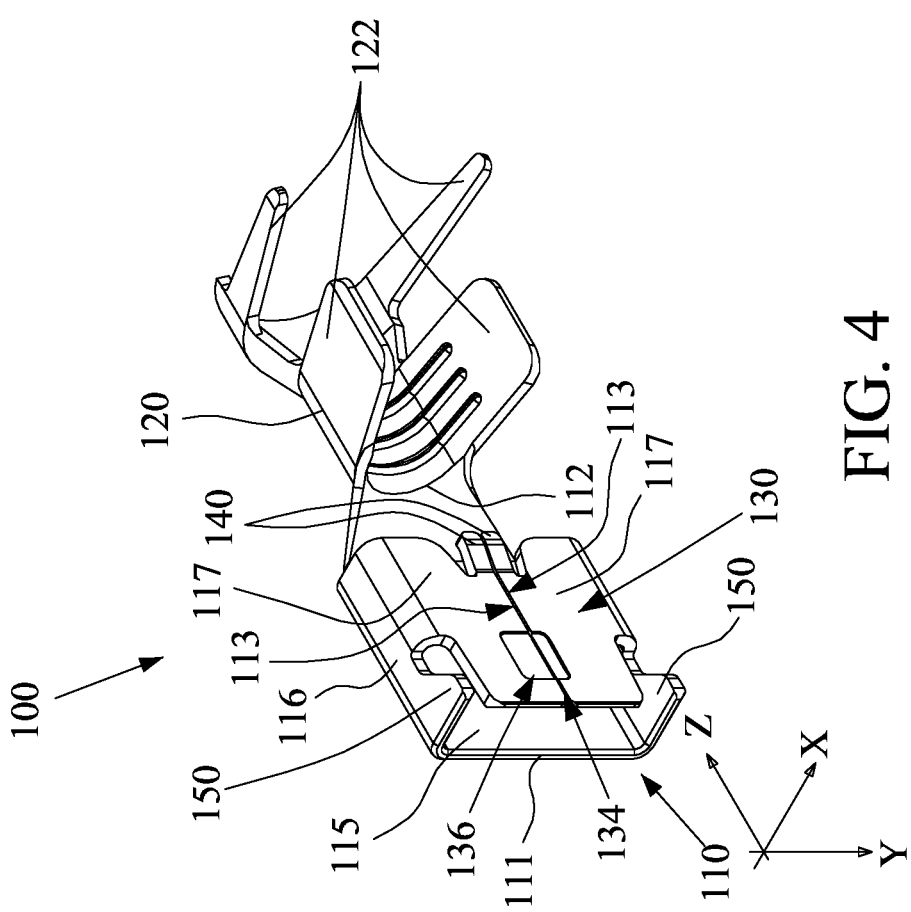
FIG. 4
FIG. 5

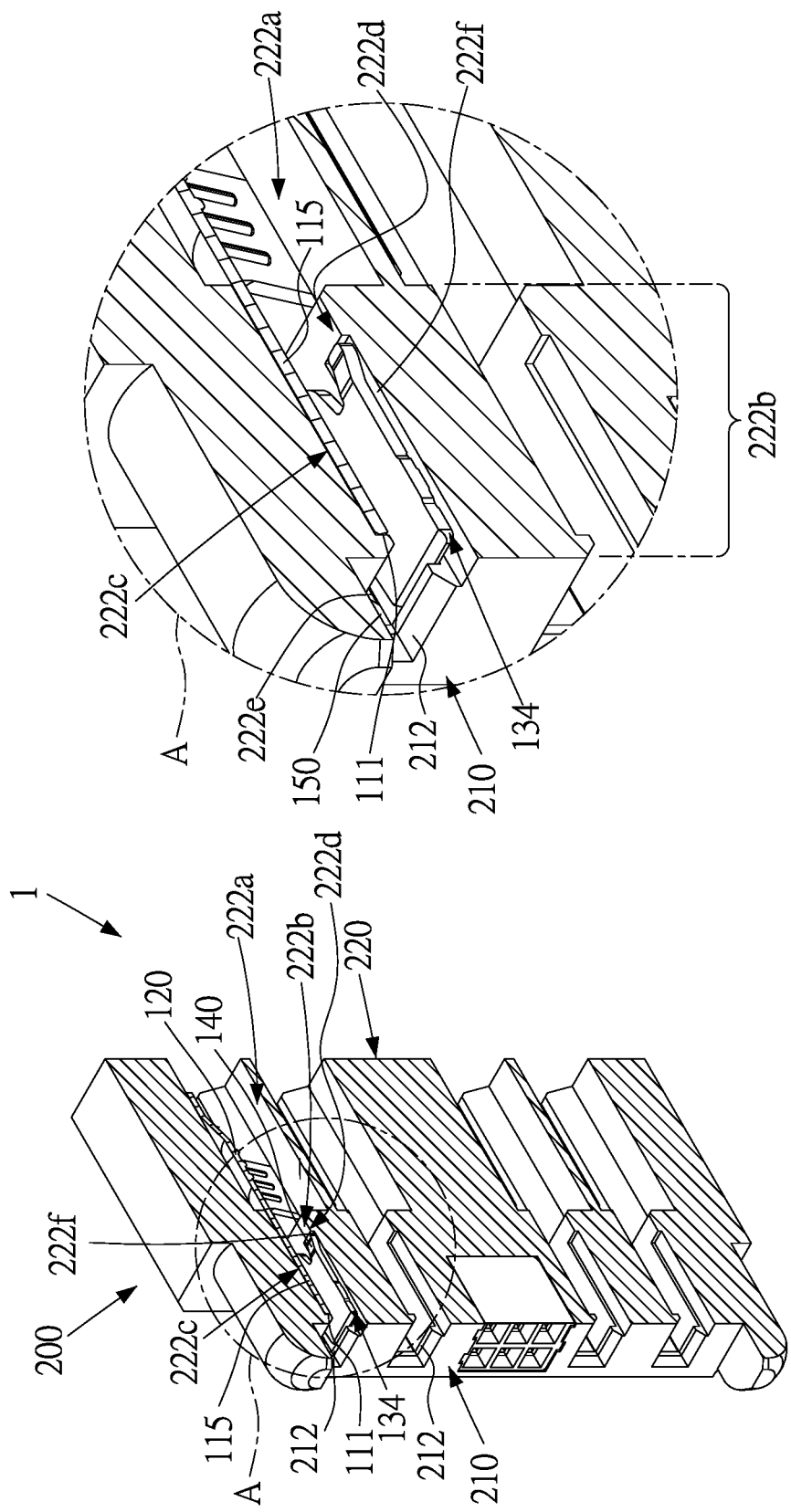

ELECTRICAL TERMINAL AND ELECTRICAL CONNECTOR THEREOF

CROSS-REFERENCE TO RELATED APPLICATION

This application claims the priority benefit of Taiwan application serial No. 108139987 filed on Nov. 4, 2019. The entirety of the above-mentioned patent application is hereby incorporated by reference herein and made a part of specification.

BACKGROUND

Technical Field

This disclosure relates to an electrical connector, and in particular, to an electrical terminal capable of being assembled/fixed quickly and an electrical connector including the electrical terminal.

Related Art

An electrical connector, for example a connector on a circuit board for transmitting power or signals, generally includes an electrical-insulated base and plural electrical terminals. The electrical terminals are used to contact external terminals. Depending on different types of external terminals, the electrical terminals are provided with different types as well.

The terminal body of the electrical terminal is usually formed into a round tube or a rectangular tube structure to match the shape of a terminal insertion hole. The terminal body can be fixed by being inserted into the terminal insertion hole.

The tube structure is usually formed by bending and butt jointing two sheets. The connection of such structure is merely maintained by the permanent deformation of the sheets itself, and there is no additional fixing mechanism at the buttjoint portion. The two sheets that are butt jointed with each other are easily deformed and separated, so that the terminal body cannot be smoothly inserted into the terminal insertion hole.

Moreover, the mounting portion of the electrical terminal is usually a long piece extended from the edge of the tube structure, and the mounting portion is of a bias configuration and is at one side of the tube structure. When electrical terminals known to the inventor(s) are inserted into the terminal insertion hole, the mounting portions of the electrical terminals should be located at specific relative positions, so as not to cause the adjacent mounting portions to interfere with each other. However, the positioning of the mounting portions depends on the visual judgment of the assembler to insert the bodies of the electrical terminals into the terminal insertion hole in a specific orientation. Such visual judgments are prone to generate errors, resulting that the electrical connectors which are defective need to be reworked or be scrapped.

SUMMARY

In order to improve the assembly operation of an electrical connector, more particularly, the fixing operation of an electrical connector, an electrical terminal is provided in this disclosure. The structure of the electrical terminal is stable and difficult to deform, and the electrical terminal can be easily and quickly fixed into the base to form an electrical connector.

An electrical terminal according to this disclosure includes a terminal body and a mounting portion. The terminal body has a front edge, a rear edge, and two opposite lateral edges. At least part of the terminal body is bent, and the two lateral edges are butt jointed to form a buttjoint portion. The buttjoint portion has a joint seam between the two lateral edges which are butt jointed, and the buttjoint portion further includes a stamped groove crossing the joint seam. The mounting portion extends from the terminal body.

In one or some embodiments, the stamped groove is recessed on a surface of the buttjoint portion along a thickness direction of the buttjoint portion.

In one or some embodiments, the terminal body further includes a panel portion, two first bent portions, and two second bent portions. The two first bent portions extend from two opposite edges of the panel portion in a first direction, respectively. The two second bent portions extend from one edge of the two first bent portions opposite to the panel portion in a second direction, respectively, and the two second bent portions are butt jointed at the joint seam to form the buttjoint portion, wherein the first direction is perpendicular to the second direction.

In one or some embodiments, the mounting portion is extending from the rear edge of the terminal body in a third direction, and the third direction is perpendicular to the first direction and the second direction.

In one or some embodiments, a recessed direction of the stamped groove is in parallel to the first direction.

In one or some embodiments, the joint seam has a zigzag path.

In one or some embodiments, a portion of each the second bent portions corresponding to the joint seam forms an extending tongue portion and an open slot butt jointed each other respectively, and the extending tongue portion is embedded in the open slot.

In one or some embodiments, the stamped groove covers a portion of the extending tongue portion and the open slot.

In one or some embodiments, the extending tongue portion and the open slot are both located at the stamped groove.

In one or some embodiments, the open slot extends in the second direction, and the open slot is defined through the second bent portion which the open slot is located; the open slot is open at the joint seam.

In one or some embodiments, the electrical terminal further includes at least a positioning protrusion, extending from one of two opposite edges of the panel portion in the first direction, and the at least positioning protrusion and the buttjoint portion are at the same side of the terminal body.

In one or some embodiments, in the first direction a height from a top end of the positioning protrusion to the panel portion is greater than a height from the buttjoint portion to the panel portion.

In one or some embodiments, the electrical terminal further includes at least one elastic buckling member, disposed on one side of the buttjoint portion corresponding to the rear edge, and an end of the at least one elastic buckling member protrudes outwardly and obliquely.

In one or some embodiments, a protruding block is disposed on one side surface of the terminal body away from the buttjoint portion.

In one or some embodiments, the electrical terminal further includes a contact portion disposed on the front edge.

In one or some embodiments, the contact portion includes a plurality of elastic contact pieces extending from the terminal body or the buttjoint portion, and a guiding bevel is formed at a front end of each of the elastic contact pieces.

An electrical connector according to this disclosure comprises the electrical terminal according to any of the embodiments and a base. The base has a front surface, a rear surface, and an outer peripheral surface. The front surface and the rear surface are opposite to each other, and the outer peripheral surface is connected to the front surface and the rear surface. At least one installation trough is formed on the rear surface, and the at least one installation trough is in communication with the front surface through an insertion hole. The at least one installation trough has an accommodation segment and a fixing segment. The accommodation segment is connected to the rear surface, and the fixing segment is connected to the front surface. The terminal body and the buttjoint portion are received in the fixing segment, and the mounting portion is received in the accommodation segment.

In one or some embodiments, the fixing segment has a first wall surface and a second wall surface opposite to each other, and the terminal body abuts against the first wall surface, and the buttjoint portion abuts against the second wall surface.

In one or some embodiments, the electrical terminal has at least one elastic buckling member disposed on one side of the buttjoint portion corresponding to the rear edge, and an end of the at least one elastic buckling member protrudes outwardly and obliquely. A notch is formed on the second wall surface for the at least one elastic buckling member being engaged into the notch.

In one or some embodiments, a cross sectional area of the insertion hole is smaller than the cross sectional area of the fixing segment, so that the fixing segment has a stepped segment with respect to the insertion hole, and the front edge of the terminal body is abutted against the stepped segment.

In one or some embodiments, a positioning convex portion and a positioning concave portion matching each other are disposed respectively on the electrical terminal and the fixing segment.

In one or some embodiments, the positioning convex portion is at least a positioning protrusion extending from one of the two lateral edges of the terminal body, and the at least the positioning protrusion and the buttjoint portion are at the same side of the terminal body. The positioning concave portion is at least a positioning groove formed on the second wall surface, and one end of the at least one positioning groove facing toward the rear surface is opened, so that the at least one positioning protrusion is adapted to be slid into the at least one positioning groove.

In one or some embodiments, the positioning convex portion is a protruding block disposed on one side surface of the terminal body facing outwardly; the positioning concave portion is a positioning dent disposed on one edge of the first wall surface corresponding to the rear surface, and the positioning dent is adapted to allow the protruding block sliding therein.

Based on one or some embodiments of this disclosure, a stamped groove is formed by applying a machinery process on the joint seam between the two butt-jointed lateral edges of the terminal body, and the stamped groove can strengthen the connection force between the two lateral edges. Thus, it may prevent the two lateral edges from being separated to cause the deformation of the terminal body, which may lead the electrical terminal cannot be inserted into the terminal insertion hole. Moreover, a positioning structure is provided in at least one embodiment of the instant disclosure, and the electrical terminal with the positioning structure can be inserted into the terminal insertion hole just when the electrical terminal is in the correct orientation, thereby avoiding assembly errors.

BRIEF DESCRIPTION OF THE DRAWINGS

This disclosure will become more fully understood from the detailed description given herein below for illustration only and thus not limitative of this disclosure, wherein:

FIG. 4 illustrates a perspective view of an electrical terminal of the first embodiment;

FIG. 5 illustrates another perspective view of the electrical terminal of the first embodiment;

FIG. 9 illustrates another perspective partial sectional view of the electrical connector of the first embodiment;

FIG. 10 illustrates an enlarged view of the portion A shown in FIG. 9;

DETAILED DESCRIPTION

Figure 1:
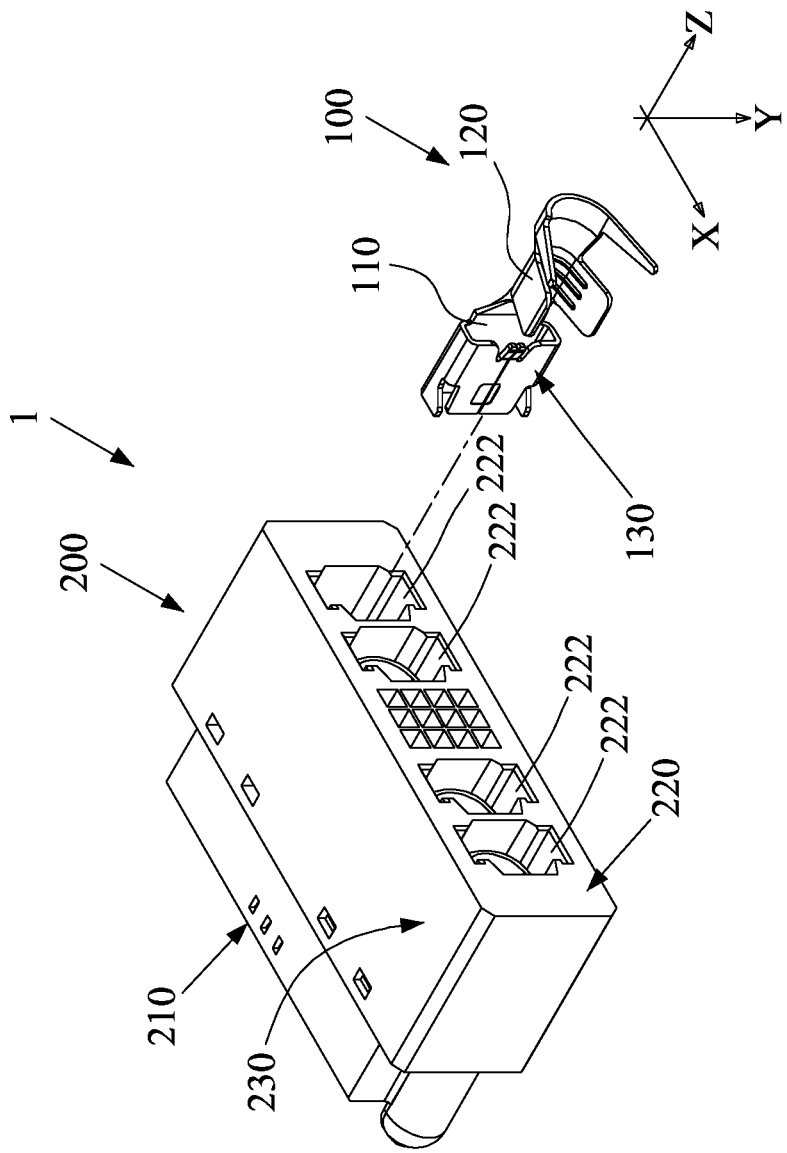
FIG. 1 illustrates an exploded view of an electrical connector according to a first embodiment according to this disclosure.
Figure 3:
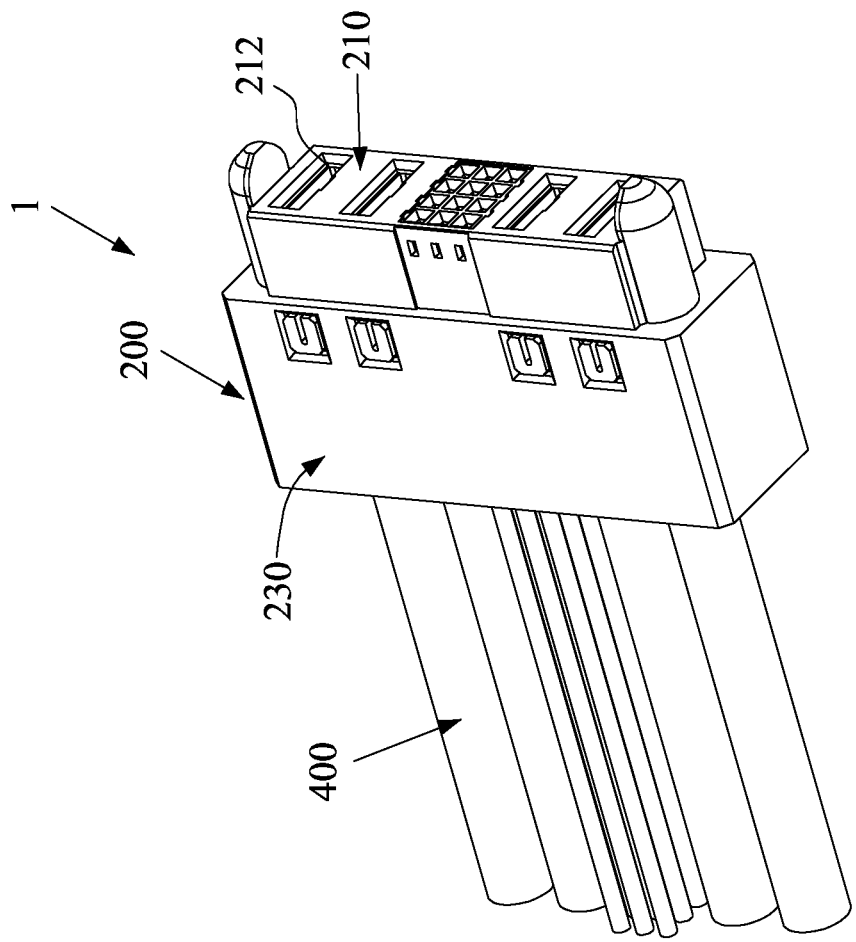
FIG. 3 illustrates a perspective view of the electrical connector of the first embodiment.
Figure 2:
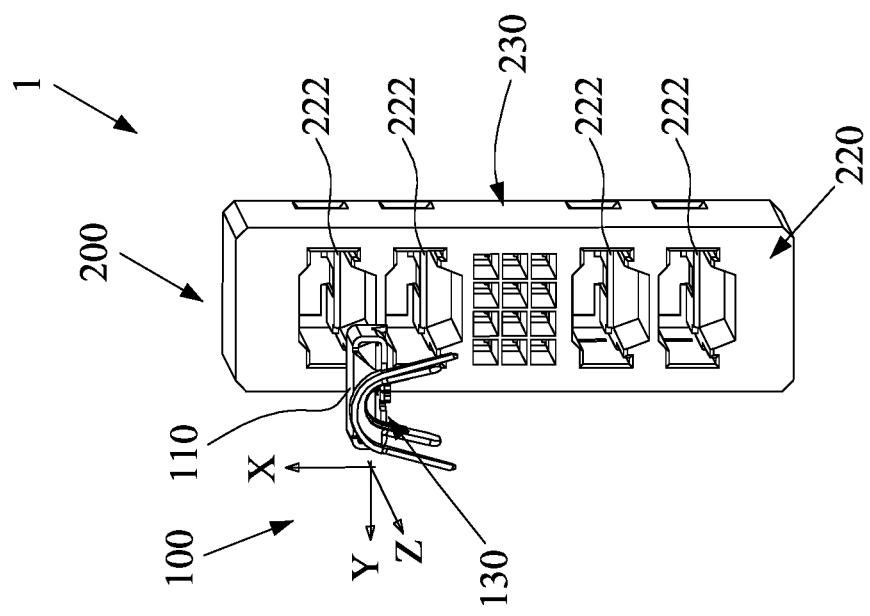
FIG. 2 illustrates another exploded view of the electrical connector of the first embodiment.

Please refer to FIGS. 1, 2, and 3, an electrical connector 1 according to a first embodiment of this disclosure is illustrated. In the first embodiment, the electrical connector 1 includes an electrical terminal 100 and a base 200.

As shown in FIG. 1 and FIG. 4, the electrical terminal 100 includes a terminal body 110 and a mounting portion 120. The terminal body 110 has a front edge 111, a rear edge 112, and two lateral edges 113, where the two lateral edges 113 are opposite to each other. At least a part of the terminal body 110 is bent, and the two lateral edges 113 are butt jointed to form a buttjoint portion 130. The buttjoint portion 130 has a joint seam 134 between the two lateral edges 113 which are butt jointed, and the buttjoint portion 130 further includes a stamped groove 136 crossing the joint seam 134. The stamped groove 136 may be formed by denting the surface of the buttjoint portion 130 with a mechanical stamping process. The stamped groove 136 is recessed on the surface of the buttjoint portion 130 along a thickness direction of the buttjoint portion 130, and thus the thickness of the stamped groove 136 is thinner than thicknesses of other portions of the buttjoint portion 130. Moreover, the material of the terminal body 110 in the stamped groove 136 will be squeezed and extend outwardly, forming a partially overlapping configuration between the two lateral edges 113 of the terminal body 110, thereby connecting the two lateral edges 113 of the terminal body 110 which are bent and butt jointed with each other. Hence, the two lateral edges 113 can be prevented from being separated from each other which would cause deformation of the terminal body 110 or the buttjoint portion 130. Moreover, the overlapping portions at the stamped groove 136 may be beneficial to make current pass through the buttjoint portion 130.

As shown in FIG. 4 and FIG. 5, the terminal body 110 further includes a panel portion 115, two first bent portions 116, and two second bent portions 117. The two first bent portions 116 extend from two opposite sides of the panel portion 115 in a first direction X, respectively. The two second bent portions 117 extend from one side of the first bent portion 116 opposite to the panel portion in a second direction Y, respectively. The two second bent portions 117 are butt jointed at the joint seam 134 to form the buttjoint portion 130. The first direction X is perpendicular to the second direction Y, and thus a cross-sectional shape of the terminal body 110 in the XY plane is rectangular. Moreover, a recessed direction of the stamped groove 136 is in parallel to the first direction X; that is, in this embodiment, the thickness direction of the buttjoint portion 130 is in parallel to the first direction X. The mounting portion 120 extends from the terminal body 110. In the first embodiment, the mounting portion 120 extends from the rear edge 112 of the terminal body 110 in a third direction Z. More specifically, in one embodiment, the mounting portion 120 extends from an edge of the panel portion 115. The third direction Z is perpendicular to the first direction X and the second direction Y. However, the portion and the direction that the mounting portion 120 extends from and extends in are not limited to the illustrated embodiments. The mounting portion 120 may extend from other portions of the terminal body 110, and may extend in other directions.

Figure 7:
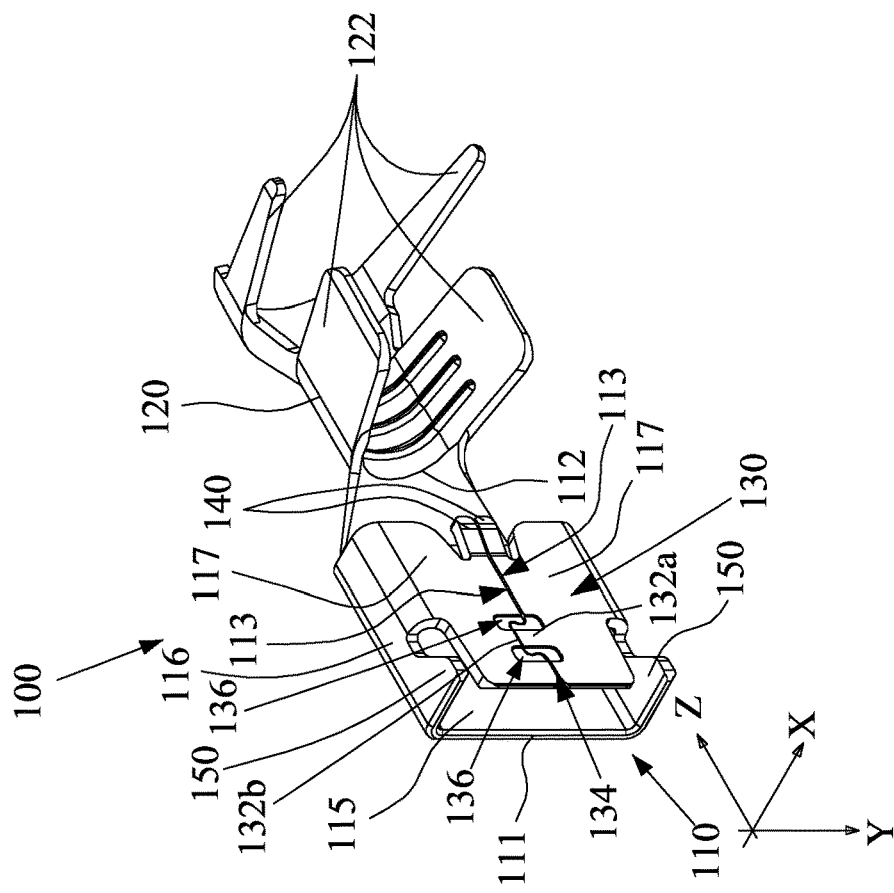
FIG. 7 illustrates still yet another perspective view of the electrical terminal of the first embodiment.
Figure 6:
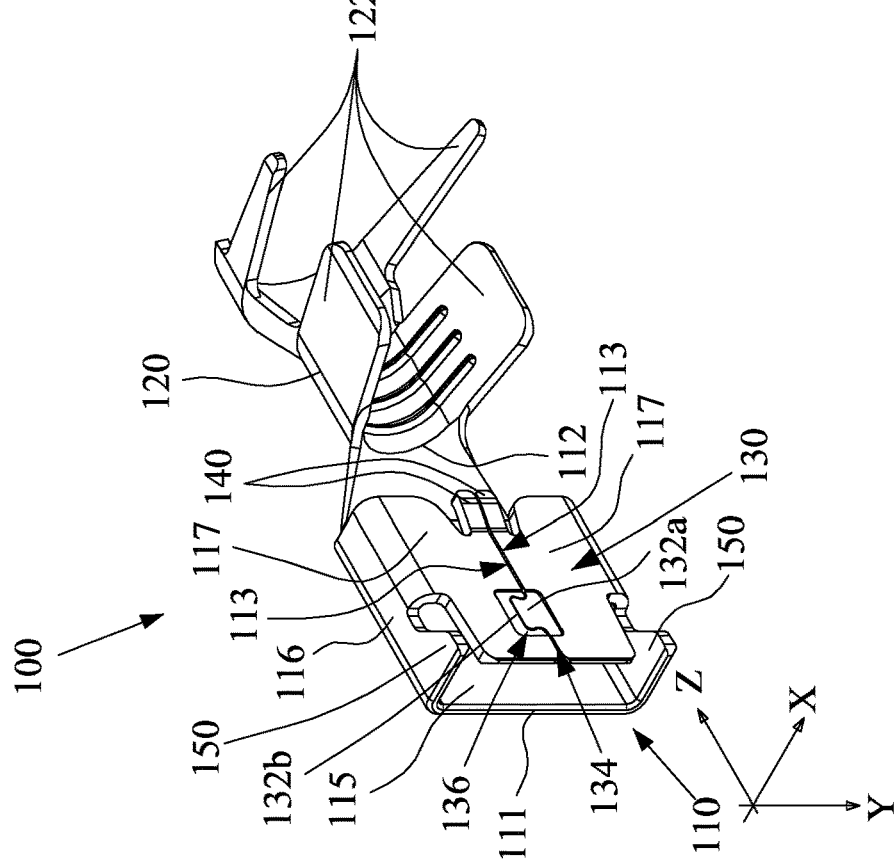
FIG. 6 illustrates still another perspective view of the electrical terminal of the first embodiment.

As shown in FIG. 6 and FIG. 7, a portion of each the second bent portion 117 corresponding to the joint seam 134 respectively forms an extending tongue portion 132a and an open slot 132b butt jointed with each other. The open slot 132b extends in the second direction Y, and is defined through the second bent portion 117 which the open slot 132b is located. The open slot 132b is open at the joint seam 134. The extending tongue portion 132a extends from the second bent portion 117 where the extending tongue portion 132a is located, and the extending tongue portion 132a extends in a direction opposite to the second direction Y and is embedded into the open slot 132b. Thus, the joint seam 134 can be lengthened, and the path of the joint seam 134 becomes a zigzag path. As shown in FIG. 6, the extending tongue portion 132a and the open slot 132b may be both located in the stamped groove 136. Alternatively, as shown in FIG. 7, in one embodiment, the stamped groove 136 covers a part of the terminal the extending tongue portion 132a and the open slot 132b, and the number of the stamped groove 136 may be two or more. The concave portion formed by the mechanical stamping process allow the extending tongue portion 132a to be tightly embedded in the open slot 132b, thereby improving the combination between the two second bent portions 117.

As shown in FIG. 4, FIG. 5, FIG. 6 and FIG. 7, the electrical terminal 100 further includes at least one elastic buckling member 140 disposed on a side of the buttjoint portion 130 corresponding to the rear edge 112, and an end of the elastic buckling member 140 protrudes outwardly and obliquely. The number of the elastic buckling member 140 may be one, and this single elastic buckling member 140 is formed on an edge of one of the two second bent portions 117. Alternatively, each of the two second bent portions 117 has an elastic buckling member 140 respectively, and the two elastic buckling members 140 are adjacent to each other, so that the joint seam 134 is further extended between the two elastic buckling members 140.

As shown in FIG. 4, FIG. 5, FIG. 6 and FIG. 7, the mounting portion 120 extends from the terminal body 110 and is used for connecting to a wire. The mounting portion 120 is provided with a fixing member 122, such as a clamping piece that can be bent. The fixing member 122 is used for being fixed onto the wire to strengthen the connection between the mounting portion 120 and the wire.

Moreover, as shown in FIG. 4, FIG. 5, FIG. 6 and FIG. 7, the electrical terminal 100 further includes two positioning protrusions 150 respectively extending from the two lateral edges 113 of the terminal body 110. The two positioning protrusions 150 and the buttjoint portion 130 are at the same side of the terminal body 110. The two positioning protrusions 150 extend from the two opposite sides of the panel portion 115 in the first direction respectively. Thus, the positioning protrusions 150 are substantially perpendicular to the panel portion 115. In the first direction X, a height from the top end of the positioning protrusions 150 to the panel portion 115 is greater than a height from the buttjoint portion 130 to the panel portion 115. Therefore, the positioning protrusions 150 protrude out from the buttjoint portion 130. More specifically, in this embodiment, the two positioning protrusions 150 and the two first bent portions 116 are formed on the opposite sides of the panel portion 115 by a bending process. The two first bent portions 116 extend from a portion of two opposite sides of the panel portion 115, and the two positioning protrusions 150 extend from other portions of the two opposite sides of the panel portion 115. In addition, in one embodiment, the electrical terminal 100 may include only one positioning protrusion 150 located on one of two opposite sides of the panel portion 115.

As shown in FIG. 1, FIG. 2, and FIG. 3, the base 200 is made of an electrical-insulated material. The base 200 has a front surface 210, a rear surface 220, and an outer peripheral surface 230. The front surface 210 and the rear surface 220 are oppositely arranged. The outer peripheral surface 230 is connected to the front surface 210 and the rear surface 220.

Figure 8:
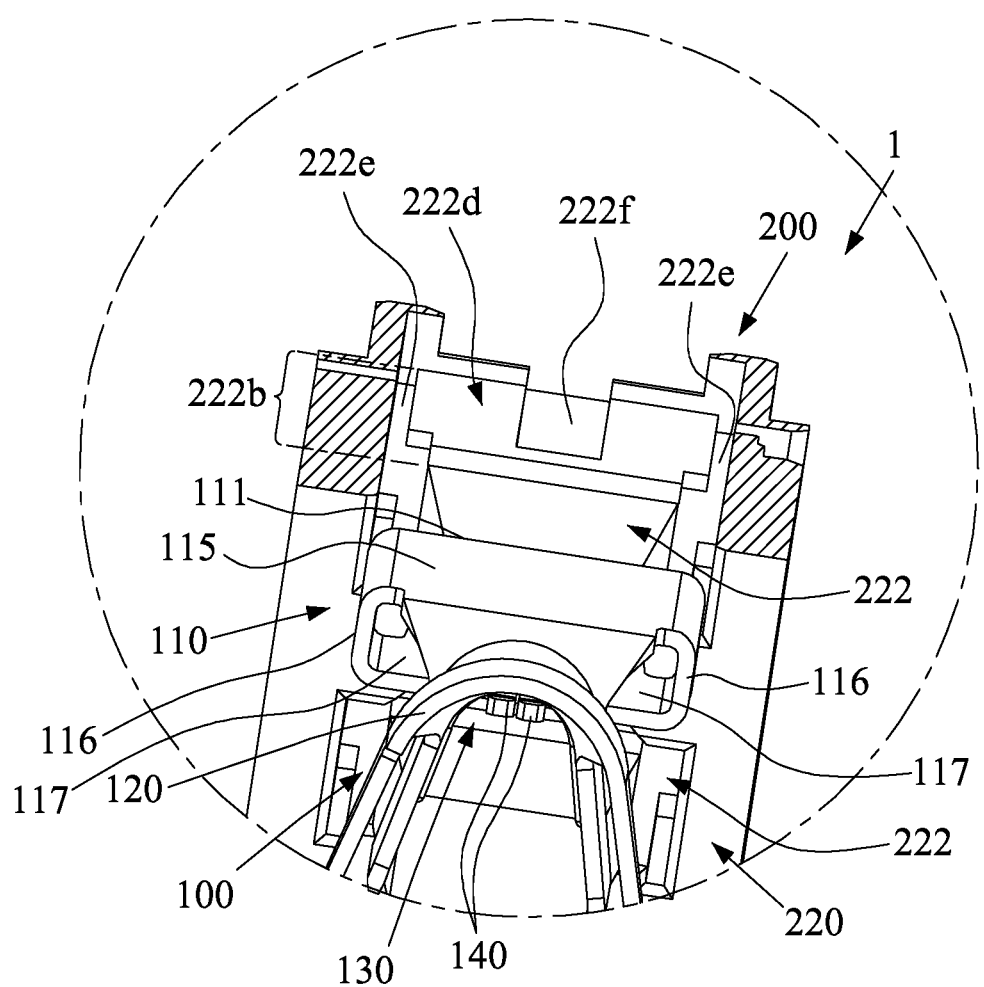
FIG. 8 illustrates a perspective partial sectional view of the electrical connector of the first embodiment.

As shown in FIG. 1, FIG. 2, and FIG. 8, a plurality of installation troughs is disposed on the rear surface 220. Each of the installation troughs is connected to the front surface 210 through an insertion hole 212.

As shown in FIG. 9, the installation trough 212 has an accommodation segment 222a connected to the rear surface 220 and a fixing segment 222b connected to the front surface 210. The shape of the cross-sectional area of the fixing segment 222b is substantially corresponding to the shape of the terminal body 110 and the shape of the buttjoint portion 130. Therefore, the terminal body 110 and the buttjoint portion 130 may be stably accommodated in the fixing segment 222b. The mounting portion 120 is accommodated in the accommodation segment 222a.

As shown in FIG. 8, FIG. 9, and FIG. 10, in particular, in this embodiment, the fixing segment 222b has a first wall surface 222c and a second wall surface 222d opposite to each other. When the electrical terminal 100 is inserted into the installation trough 222, the terminal body 110 abuts against the first wall surface 222c by the panel portion 115; the buttjoint portion 130 formed by the two second bent portions 117 abuts against the second wall surface 222d.

Two positioning grooves 222e are disposed on the second wall surface 222d. One end of each of the positioning grooves 222e facing toward the rear surface 220 is an open end, so that the positioning protrusion 150 is adapted to be slid into the positioning groove 222e. Therefore, if taking an orientation of the electrical terminal 100 that the panel portion 115 corresponds to the second wall surface 222d and the buttjoint portion 130 corresponds to the first wall surface 222c to insert the electrical terminal 100 into the fixing segment 222b, then the positioning protrusion 150 may provide a stopping function. Thus, the terminal body 110 of the electrical terminal 100 cannot be inserted into the fixing segment 222b, and it may prevent the electrical terminal 100 from being inserted into the installation trough 222 in a wrong orientation.

Moreover, as shown in FIG. 8, FIG. 9, and FIG. 10, a notch 222f is formed on the second wall surface 222d for the elastic buckling member 140 being engaged into the notch 222f Thereby preventing the electrical terminal 100 from detaching off the base 200 along a direction toward the rear surface 220. Moreover, the cross-sectional area of the insertion hole 212 is smaller than the cross-sectional area of the fixing segment 222b, and thus the fixing segment 222b has a stepped segment with respect to the insertion hole 212. When the elastic buckling member 140 is engaged into the notch 222f, the front edge 111 of the terminal body 110 is also abutted against the stepped segment. Thus, the electrical terminal 100 cannot be detached off the insertion hole 212. The elastic buckling member 140 may be disposed on other portions of the electrical terminal 100. For example, the elastic buckling member 140 may be disposed on the panel portion 115, and the notch 222f may be configured on the first wall surface 222c correspondingly. Under such arrangement, the configuration still can be used for the fixation of the electrical terminal 100, preventing the electrical terminal 100 from detaching off the insertion hole 212.

Figure 12:
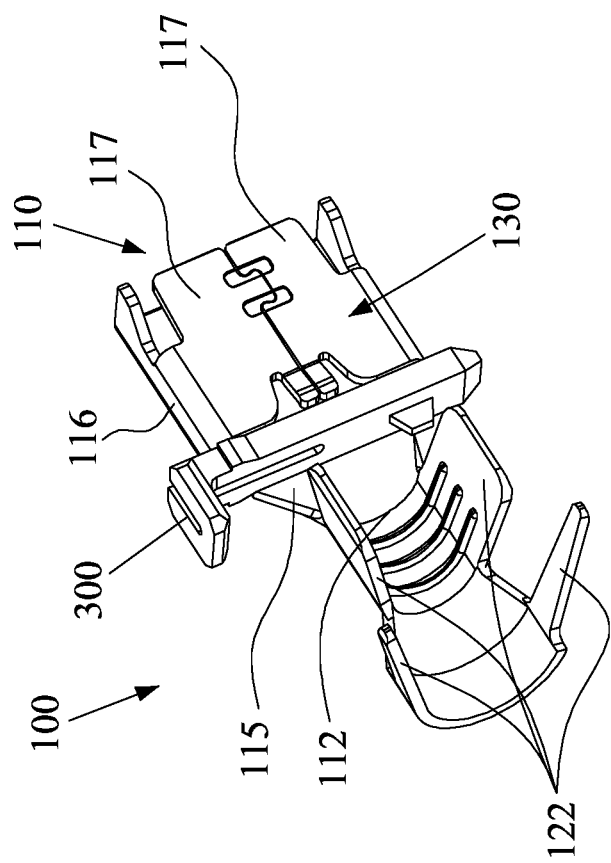
FIG. 12 illustrates a perspective view of the electrical terminal and the fixing pin of the first embodiment.
Figure 11:
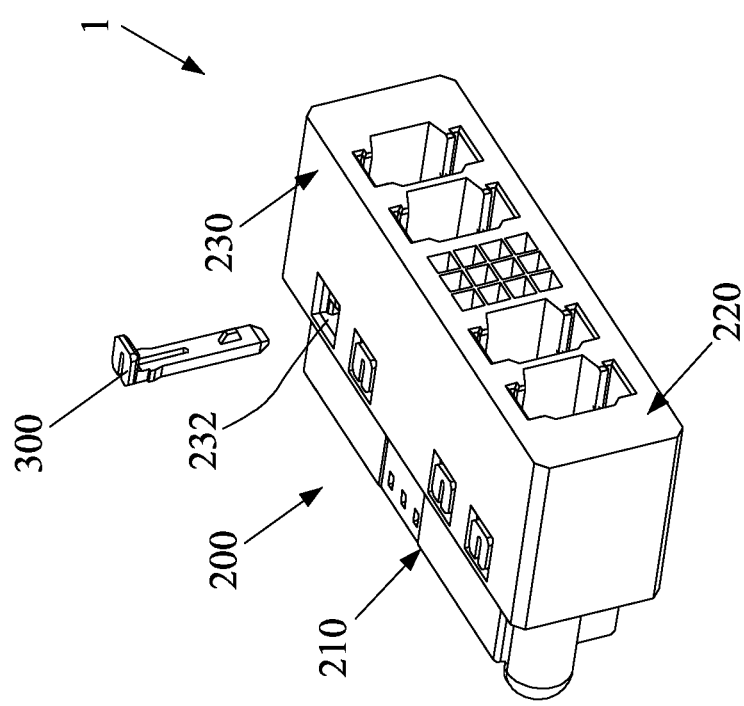
FIG. 11 illustrates an exploded view of the electrical connector and a fixing pin of the first embodiment.

As shown in FIG. 11 and FIG. 12, the base 200 further includes a pin hole 232. The pin hole 232 is disposed on the outer peripheral surface 230 of the base 200, and is communicated to the installation trough 222. The pin hole 232 is used for the insertion of a fixing pin 300. A portion of the buttjoint portion 130 corresponding to the rear edge 112 abuts against the fixing pin 300, and the electrical terminal 100 can be further fixed.

Figure 14:
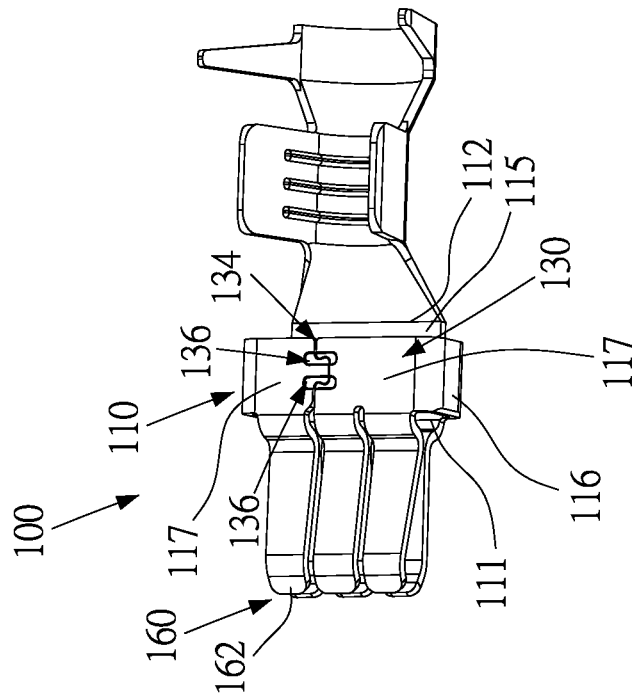
FIG. 14 illustrates a perspective view of the electrical terminal of the second embodiment.
Figure 13:
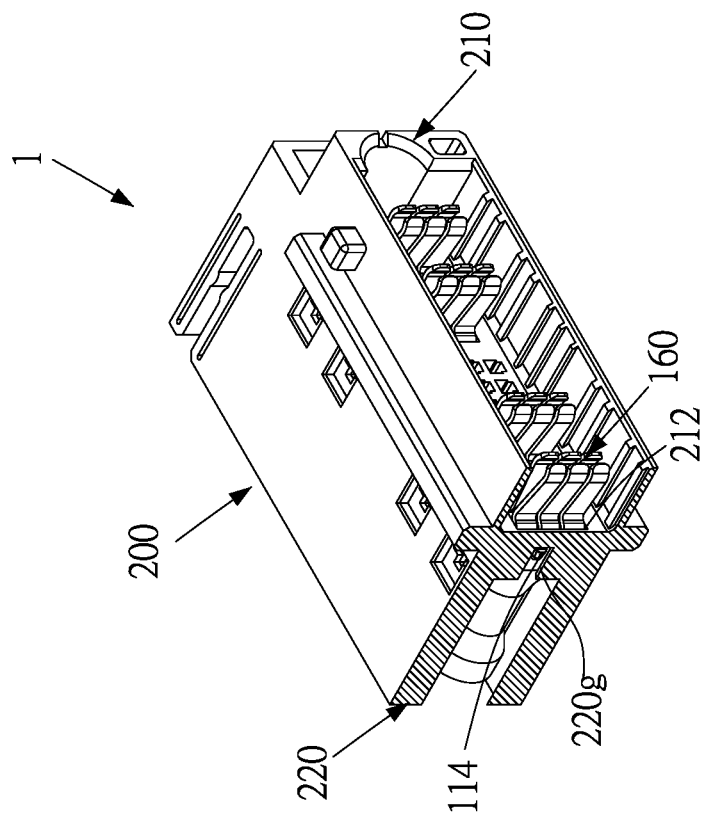
FIG. 13 illustrates a perspective partial sectional view of the electrical connector according to a second embodiment of this instant disclosure.
Figure 15:
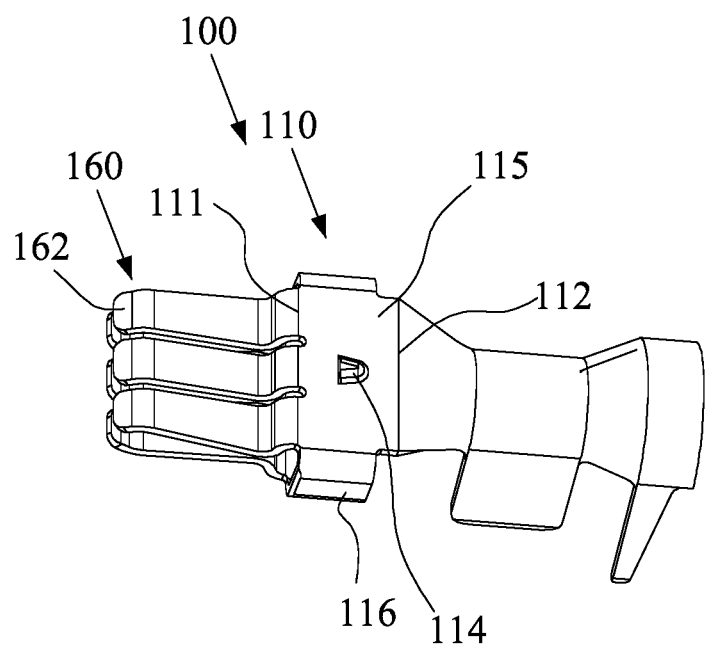
FIG. 15 illustrates another perspective view of the electrical terminal of the second embodiment.

Please refer to FIG. 13, FIG. 14, and FIG. 15, an electrical connector 1 illustrated according to the second embodiment of the instant disclosure includes an electrical terminal 100 and a base 200.

As shown in FIG. 14 and FIG. 15, some features of the electrical terminal 100 are the same as those of the first embodiment, and the differences will be described below. In the second embodiment, the electrical terminal 100 further includes a contact portion 160 disposed at the front edge 111 of the terminal body 110. The contact portion 160 includes a plurality of elastic contact pieces extending from the terminal body 110 or the buttjoint portion 130. The elastic contact pieces may be configured in pairs and disposed on the main terminal body 110 and the buttjoint portion 130. A guiding bevel 162 inclined inward may be formed on a front end of the elastic contact pieces.

As shown in FIG. 13, the contact portion 160 is adapted to be inserted into the insertion hole 212, and is further protruded from the front surface 210. A side retaining wall is formed surroundingly on an edge of the front surface 210. The space surrounded by the side retaining wall is used for receiving another electrical connector 1. For example, the electrical connector 1 described in the first embodiment can be inserted into the space surrounded by the side retaining wall. At the same time, the contact portion 160 can be further inserted into the insertion hole 212 of the other electrical connector 1 and contact the electrical terminal 100 thereof.

Figure 16:
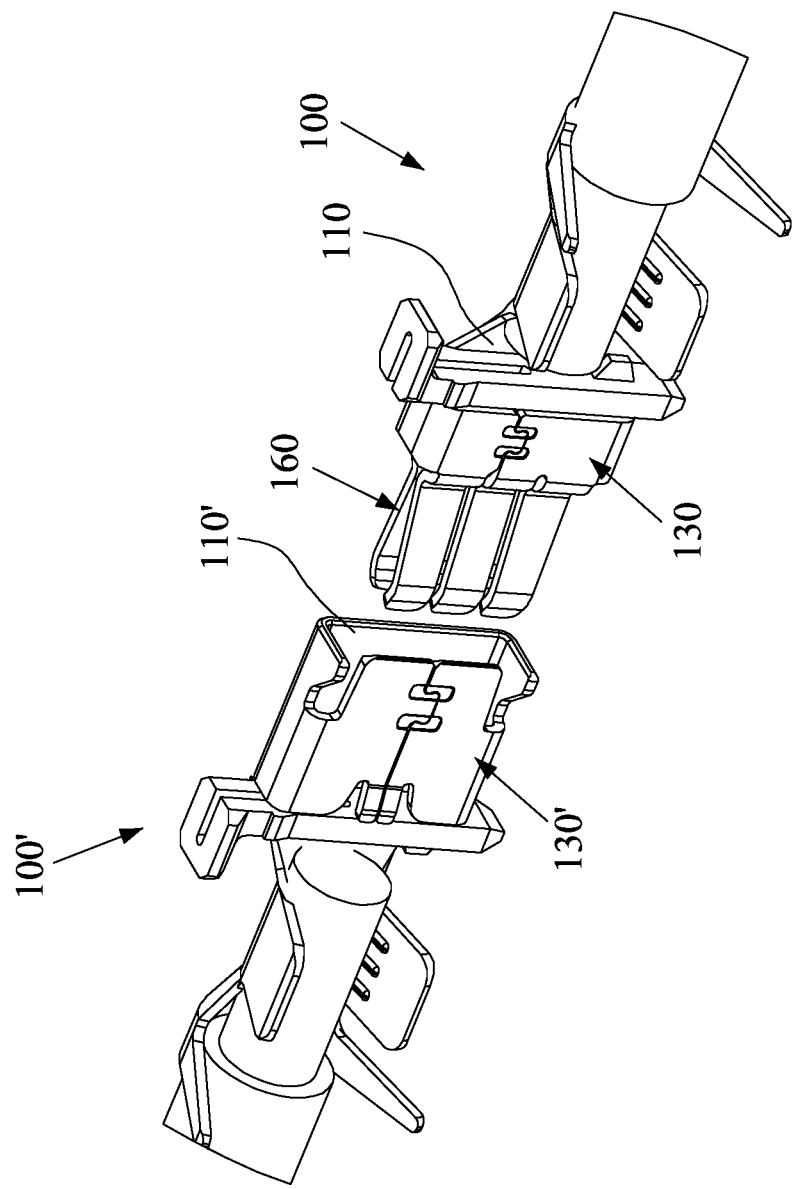
FIG. 16 illustrates a perspective view of the electrical terminal and an external terminal of the second embodiment.

As shown in FIG. 15 and FIG. 16, the electrical terminal 100 of the second embodiment and the external terminal 100' of the second embodiment (that is, the electrical terminal 100 of the first embodiment) are matched with each other. The contact portion 160 can be inserted between the terminal body 110' and the buttjoint portion 130' of the external terminal 100', thereby allowing a proper contact between the electrical terminal 100 and the external terminal 100' for electrical connection. In this embodiment, the guiding bevel 162 is beneficial to guide the elastic contact pieces to be inserted between the terminal body 110' and the buttjoint portion 130'.

As shown in FIG. 11 and FIG. 13, the second embodiment has a positioning structure different from that of the first embodiment. In the second embodiment, a protruding block 114 is disposed on one side surface of the terminal body 110 facing outwardly. That is, in this embodiment, the side surface of the panel portion 115 away from the buttjoint portion 130 is provided with a protruding block 114. The fixing segment 222b of the base 200 also has a first wall surface 222c and a second wall surface 222d opposite to each other. The second wall surface 222d of the second embodiment is not provided with a positioning groove 222e; instead, a positioning groove 220g is disposed on the edge of the first wall surface 222c corresponding to the rear surface 220, and the positioning groove 220g is adapted to allow the protruding block 114 sliding therein.

Therefore, if the electrical terminal 100 is inserted with an orientation that the panel portion 115 of the terminal body 110 corresponds to the second wall surface 222d and the buttjoint portion 130 corresponds to the first wall surface 222c, the protruding block 114 can stop the electrical terminal 100 from being inserted into the fixing segment 222b. The number of the positioning groove 220g and the number of the protruding block 114 are not limited to one. Alternatively, a plurality of the positioning grooves 220g and a plurality of the protruding blocks 114 can be disposed on the base 200 and the electrical terminal 100 respectively, as long as the electrical terminal 100 can be inserted into the fixing segment 222b in the correct orientation and the protruding blocks 114 can be slid into the corresponding positioning grooves 220g. In other words, a positioning concave portion and a positioning convex portion matching each other can be disposed on the electrical terminal 100 and the fixing segment 222b, respectively. Through sliding the positioning convex portion into the positioning convex portion, the electrical terminal 100 can be inserted into the fixing segment 222b in the correct orientation. The positioning convex portion may be a positioning protrusion 150 and/or a protruding block 114, and the position of the positioning convex portion may be located on the terminal body 110 or the buttjoint portion 130. The positioning concave portion may be a positioning groove 222e and/or a positioning groove 220g, and the position of the positioning concave portion may be located on the first wall surface 222c or the second wall surface 222d.

In one embodiment or some embodiments of this disclosure, the stamped groove 136 which is formed by applying a machinery process on the joint seam 134 between the two butt-jointed lateral edges of the terminal body 110 can strengthen the connection force between the two lateral edges 113. Thus, it may prevent the two lateral edges 113 from being separated to cause the deformation of the terminal body 110, which may lead the electrical terminal 100 cannot be inserted into the terminal insertion hole 212. Moreover, in at least one embodiment of the instant disclosure, a positioning structure is provided, which ensures that the electrical terminal 100 can be inserted into the terminal insertion hole 212 just when the orientation is correct, thereby avoiding assembly errors.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An electrical terminal, comprising:
   a terminal body, having a front edge, a rear edge, and two lateral edges, the two lateral edges being opposite to each other, wherein at least part of the terminal body is bent, and the two lateral edges are butt jointed to form a buttjoint portion; the buttjoint portion has a joint seam between the two lateral edges which are butt jointed, and an extending tongue portion and an open slot are formed at the joint seam, the extending tongue portion and the open slot butt jointed each other, and the extending tongue portion is embedded in the open slot; the buttjoint portion further comprises a stamped groove crossing the joint seam, and the stamped groove covers a portion of the extending tongue portion and the open slot; and
   a mounting portion extending from the terminal body.

2. The electrical terminal according to claim 1, wherein the stamped groove is recessed on a surface of the buttjoint portion along a thickness direction of the buttjoint portion.

3. The electrical terminal according to claim 1, wherein the terminal body further comprises:
   a panel portion;
   two first bent portions, extending from two opposite edges of the panel portion in a first direction, respectively; and
   two second bent portions, extending from one edges of the two first bent portions opposite to the panel portion in a second direction, respectively, and the two second bent portions are butt jointed at the joint seam to form the buttjoint portion, wherein the first direction is perpendicular to the second direction.

4. The electrical terminal according to claim 3, wherein the mounting portion is extending from the rear edge of the terminal body in a third direction, and the third direction is perpendicular to the first direction and the second direction.

5. The electrical terminal according to claim 3, wherein a recessed direction of the stamped groove is in parallel to the first direction.

6. The electrical terminal according to claim 3, wherein the joint seam has a zigzag path.

7. The electrical terminal according to claim 6, wherein the extending tongue portion and the open slot butt respectively been formed in a portion of each the second bent portions corresponding to the joint seam.

8. The electrical terminal according to claim 6, wherein the open slot extends in the second direction, and the open slot is defined through the second bent portion which the open slot is located; the open slot is open at the joint seam.

9. The electrical terminal according to claim 3, further comprising: at least one positioning protrusion, extending from one of two opposite edges of the panel portion in the first direction, and the at least one positioning protrusion and the buttjoint portion are at the same side of the terminal body.

10. The electrical terminal according to claim 9, wherein in the first direction a height from a top end of the positioning protrusion to the panel portion is greater than a height from the buttjoint portion to the panel portion.

11. The electrical terminal according to claim 1, further comprising at least one elastic buckling member, disposed on one side of the buttjoint portion corresponding to the rear edge, and a tip of the at least one elastic buckling member protrudes outwardly and obliquely.

12. The electrical terminal according to claim 1, wherein a protruding block is disposed on one side surface of the terminal body away from the buttjoint portion.

13. The electrical terminal according to claim 1, further comprising a contact portion disposed on the front edge.

14. The electrical terminal according to claim 1, wherein the contact portion comprises a plurality of elastic contact pieces extending from the terminal body or the buttjoint portion, and a guiding bevel is formed at a front end of each of the elastic contact pieces.

15. An electrical connector, comprising:
   the electrical terminal according to claim 1; and
   a base, having a front surface, a rear surface, and an outer peripheral surface, wherein the front surface and the rear surface are opposite to each other, and the outer peripheral surface is connected to the front surface and the rear surface; at least one installation trough is formed on the rear surface, and the installation trough is in communication with the front surface through an insertion hole; the at least one installation trough has an accommodation segment and a fixing segment; wherein the accommodation segment is connected to the rear surface, and the fixing segment is connected to the front surface, the terminal body and the buttjoint portion are received in the fixing segment, and the mounting portion is received in the accommodation segment.

16. The electrical connector according to claim 15, wherein the fixing segment has a first wall surface and a second wall surface opposite to each other and the terminal body abuts against the first wall surface, and the buttjoint portion abuts against the second wall surface.

17. The electrical connector according to claim 16, wherein the electrical terminal has at least one elastic buckling member disposed on one side of the buttjoint portion corresponding to the rear edge, and a tip of the at least one elastic buckling member protrudes outwardly and obliquely; a notch is formed on the second wall surface for the at least one elastic buckling member being engaged into the notch.

18. The electrical connector according to claim 16, wherein a cross sectional area of the insertion hole is smaller than the cross sectional area of the fixing segment, so that the fixing segment has a stepped segment with respect to the insertion hole, and the front edge of the terminal body is abutted against the stepped segment.

19. The electrical connector according to claim 16, wherein a positioning convex portion and a positioning concave portion matching each other are disposed respectively on the electrical terminal and the fixing segment.

20. The electrical connector according to claim 19, wherein the positioning convex portion is at least a positioning protrusion extending from one of the two lateral edges of the terminal body, and the at least one positioning protrusion and the buttjoint portion are at the same side of the terminal body; the positioning concave portion is at least a positioning groove formed on the second wall surface, and one end of the at least one positioning groove facing toward the rear surface is opened, so that the at least one positioning protrusion is adapted to be slid into the at least one positioning groove.

21. The electrical connector according to claim 20, wherein the positioning convex portion is a protruding block disposed on one side surface of the terminal body away from the buttjoint portion; the positioning concave portion is a positioning dent disposed on one edge of the first wall surface corresponding to the rear surface, and the positioning dent is adapted to allow the protruding block sliding therein.

22. An electrical terminal, comprising:
- a terminal body, having a front edge, a rear edge, and two lateral edges, the two lateral edges being opposite to each other, wherein at least part of the terminal body is bent, and the two lateral edges are butt jointed to form a buttjoint portion; the buttjoint portion has a joint seam between the two lateral edges which are butt jointed, and an extending tongue portion and an open slot are formed at the joint seam, the extending tongue portion and the open slot butt jointed each other, and the extending tongue portion is embedded in the open slot; the buttjoint portion further comprises a stamped groove crossing the joint seam; and
- a mounting portion extending from the terminal body;
- wherein the extending tongue portion and the open slot are both located at the stamped groove.

* * * * *